(12) United States Patent
Nishimura

(10) Patent No.: US 8,129,285 B2
(45) Date of Patent: Mar. 6, 2012

(54) SUBSTRATE PROCESSING SYSTEM

(75) Inventor: Eiichi Nishimura, Nirasaki (JP)

(73) Assignee: Tokyo Electron Limited, Tokyo (JP)

(*) Notice: Subject to any disclaimer, the term of this patent is extended or adjusted under 35 U.S.C. 154(b) by 281 days.

(21) Appl. No.: 12/501,775

(22) Filed: Jul. 13, 2009

(65) Prior Publication Data

US 2009/0275201 A1    Nov. 5, 2009

Related U.S. Application Data

(62) Division of application No. 11/674,799, filed on Feb. 14, 2007, now abandoned.

(60) Provisional application No. 60/783,842, filed on Mar. 21, 2006.

(30) Foreign Application Priority Data

Mar. 8, 2006    (JP) .................................. 2006-062883

(51) Int. Cl.
*H01L 21/302* (2006.01)
*H01L 21/461* (2006.01)

(52) U.S. Cl. ........... 438/716; 438/758; 438/706; 216/58
(58) Field of Classification Search .................. 438/706, 438/716, 758, 694; 216/58
See application file for complete search history.

(56) References Cited

U.S. PATENT DOCUMENTS

| 5,201,987 | A  | 4/1993 | Hawkins et al. |
| 6,207,005 | B1 | 3/2001 | Henley et al. |
| 6,699,531 | B1 | 3/2004 | Fukiage |
| 2004/0050496 | A1* | 3/2004 | Iwai et al. ................ 156/345.51 |
| 2005/0016462 | A1 | 1/2005 | Yamazaki |
| 2007/0031609 | A1 | 2/2007 | Kumar et al. |

FOREIGN PATENT DOCUMENTS

JP    2005-347620    12/2005

* cited by examiner

*Primary Examiner* — Roberts Culbert
(74) *Attorney, Agent, or Firm* — Oblon, Spivak, McClelland, Maier & Neustadt, L.L.P.

(57) ABSTRACT

A substrate processing method implemented in a substrate processing system that includes an etching apparatus that carries out plasma etching processing on a substrate and a vacuum-type substrate transferring apparatus to which the etching apparatus is connected is provided. A first step includes forming a protective film on a rear surface of the substrate before the plasma etching processing is carried out. The protective film prevents the rear surface of the substrate from being scratched by an electrostatic chuck that electrostatically attracts the substrate during the plasma etching processing. A second step includes electrostatically attracting the substrate to the electrostatic chuck such that the electrostatic chuck directly contacts the rear surface of the substrate and of carrying out the plasma etching processing on the substrate. A third step includes removing the protective film from the rear surface of the substrate after the plasma etching processing has been carried out.

12 Claims, 6 Drawing Sheets

SUBSTRATE PROCESSING SYSTEM

CROSS-REFERENCE TO RELATED APPLICATIONS

The present application is a division of application Ser. No. 11/674,799 filed on Feb. 14, 2007, which claims benefit of U.S. provisional application Ser. No. 60/783,842, filed on Mar. 21, 2006 and Japanese Patent Application No. 2006-062883 filed on Mar. 8, 2006. The entire contents of application Ser. No. 11/674,799 is incorporated hereinto by reference.

BACKGROUND OF THE INVENTION

1. Field of the Invention

The present invention relates to a substrate processing system, and in particular to a substrate processing system having an etching apparatus having therein an electrostatic chuck that electrostatically attracts a substrate.

2. Description of the Related Art

A substrate processing system for forming wiring grooves or via holes in a desired pattern using plasma on a front surface of a wafer as a substrate is comprised of a photoresist apparatus for forming a resist film in a desired pattern on the front surface of the wafer, an etching apparatus for subjecting the front surface of the wafer to etching processing such as RIE (reactive ion etching) processing, and a washing apparatus for removing the resist film. Here, the photoresist apparatus has a coater that coats a photosensitive resin onto the front surface of the wafer, a stepper that exposes the photosensitive resin, and a developer that removes uncured photosensitive resin from the front surface of the wafer. Moreover, the etching apparatus has a housing chamber that houses the wafer and in which plasma is produced, and an electrostatic chuck that is disposed in the housing chamber and electrostatically attracts the wafer thereto while the wafer is being subjected to the etching processing (see, for example, Japanese Laid-open Patent Publication (Kokai) No. 2005-347620).

Using the stepper, the photosensitive resin on the front surface of the wafer is irradiated with UV light or the like in a desired pattern. In recent years, as the desired pattern has become finer, UV light of a shorter wavelength, for example a wavelength of 193 nm, has come to be used. If the wavelength is shorter, then the depth of focus is also reduced, and hence the tolerances on the flatness and the inclination of the wafer are reduced. Moreover, with such a stepper, a plurality of pin-like projections support a rear surface of the wafer, and hence the flatness and the inclination of the wafer are greatly affected by scratches, foreign matter etc. on the rear surface of the wafer.

Furthermore, to realize a complex semiconductor device wiring structure or electrode structure on a wafer, the wafer must be subjected to etching processing in the substrate processing system repeatedly, and each time the etching processing is carried out, the wafer is electrostatically attracted to the electrostatic chuck. The surface of the electrostatic chuck is covered with yttria ($Y_2O_3$), and hence the rear surface of the attracted wafer, which is made of silicon (Si), may be scratched. Moreover, foreign matter present on the surface of the electrostatic chuck may be transferred onto the rear surface of the wafer.

However, although foreign matter attached to the rear surface of a wafer can be removed by wet washing using a washing liquid or the like, no method is known for effectively removing scratches from the rear surface of a wafer. There is thus a fear that it may become impossible to maintain the flatness of a wafer within the allowed tolerance due to such scratches on the rear surface of the wafer. It is thus necessary to prevent the rear surface of a wafer from being scratched when the wafer is attracted by the electrostatic chuck.

SUMMARY OF THE INVENTION

It is an object of the present invention to provide a substrate processing system that enables scratching of the rear surface of a substrate to be prevented.

To attain the above object, according to the present invention, there is provided a substrate processing system comprising: an etching apparatus that carries out plasma etching processing on a substrate, the etching apparatus having therein an electrostatic chuck that electrostatically attracts the substrate, the electrostatic chuck contacting a rear surface of the substrate; a vacuum-type substrate transferring apparatus to which the etching apparatus is connected; a protective film forming apparatus that forms a protective film on the rear surface of the substrate before the plasma etching processing is carried out; and a protective film removing apparatus that removes the protective film from the rear surface of the substrate after the plasma etching processing has been carried out.

According to the above construction, a protective film is formed on the rear surface of the substrate before the plasma etching processing is carried out, and then the protective film is removed from the rear surface of the substrate after the plasma etching processing has been carried out. As a result, the electrostatic chuck contacts the protective film formed on the rear surface of the substrate. The rear surface of the substrate can thus be prevented from being scratched when the substrate is attracted to the electrostatic chuck.

Preferably, the protective film forming apparatus forms the protective film through vapor deposition processing.

According to the above construction, the protective film forming apparatus forms the protective film through vapor deposition processing. As a result, the protective film can be formed reliably.

More preferably, the vapor deposition processing is CVD processing.

According to the above construction, the protective film forming apparatus forms the protective film through CVD processing. The protective film forming apparatus is thus a vacuum-type processing apparatus. Here, the etching apparatus is also a vacuum-type processing apparatus, and hence the protective film forming apparatus and the etching apparatus can be connected together via the vacuum-type substrate transferring apparatus. As a result, the formation of the protective film and the plasma etching processing on the substrate can be carried out one after the other smoothly.

Alternatively, the substrate processing system further comprises an atmospheric-type substrate transferring apparatus connected to the vacuum-type substrate transferring apparatus, wherein the protective film forming apparatus is connected to the atmospheric-type substrate transferring apparatus, and forms the protective film through coating processing.

According to the above construction, the protective film forming apparatus forms the protective film through coating processing. As a result, the protective film can be formed easily. Moreover, foreign matter may be produced in the protective film forming apparatus during the coating processing, but because the protective film forming apparatus is connected to the atmospheric-type substrate transferring apparatus and hence is not connected to the vacuum-type substrate transferring apparatus directly, foreign matter produced in the protective film forming apparatus can be prevented from infiltrating into the etching apparatus via the vacuum-type substrate transferring apparatus.

Preferably, the protective film removing apparatus removes the protective film through ashing processing.

According to the above construction, the protective film removing apparatus removes the protective film through ashing processing. The protective film removing apparatus is thus a vacuum-type processing apparatus. Here, the etching apparatus is also a vacuum-type processing apparatus, and hence the etching apparatus and the protective film removing apparatus can be connected together via the vacuum-type substrate transferring apparatus. As a result, the plasma etching processing on the substrate and the removal of the protective film can be carried out one after the other smoothly.

Alternatively, the substrate processing system further comprises an atmospheric-type substrate transferring apparatus connected to the vacuum-type substrate transferring apparatus, wherein the protective film removing apparatus is connected to the atmospheric-type substrate transferring apparatus, and removes the protective film through wet washing processing.

According to the present invention, the protective film removing apparatus removes the protective film through wet washing processing. As a result, the protective film can be removed easily. Moreover, a washing liquid may be scattered from the protective film removing apparatus during the wet washing processing, but because the protective film removing apparatus is connected to the atmospheric-type substrate transferring apparatus and hence is not connected to the vacuum-type substrate transferring apparatus directly, washing liquid and the like can be prevented from infiltrating into the etching apparatus via the vacuum-type substrate transferring apparatus.

The above and other objects, features, and advantages of the invention will become more apparent from the following detailed description taken in conjunction with the accompanying drawings.

DESCRIPTION OF THE PREFERRED EMBODIMENTS

Embodiments of the present invention will be described below with reference to the drawings.

First, a substrate processing system according to a first embodiment of the present invention will be described.

Figure 1:
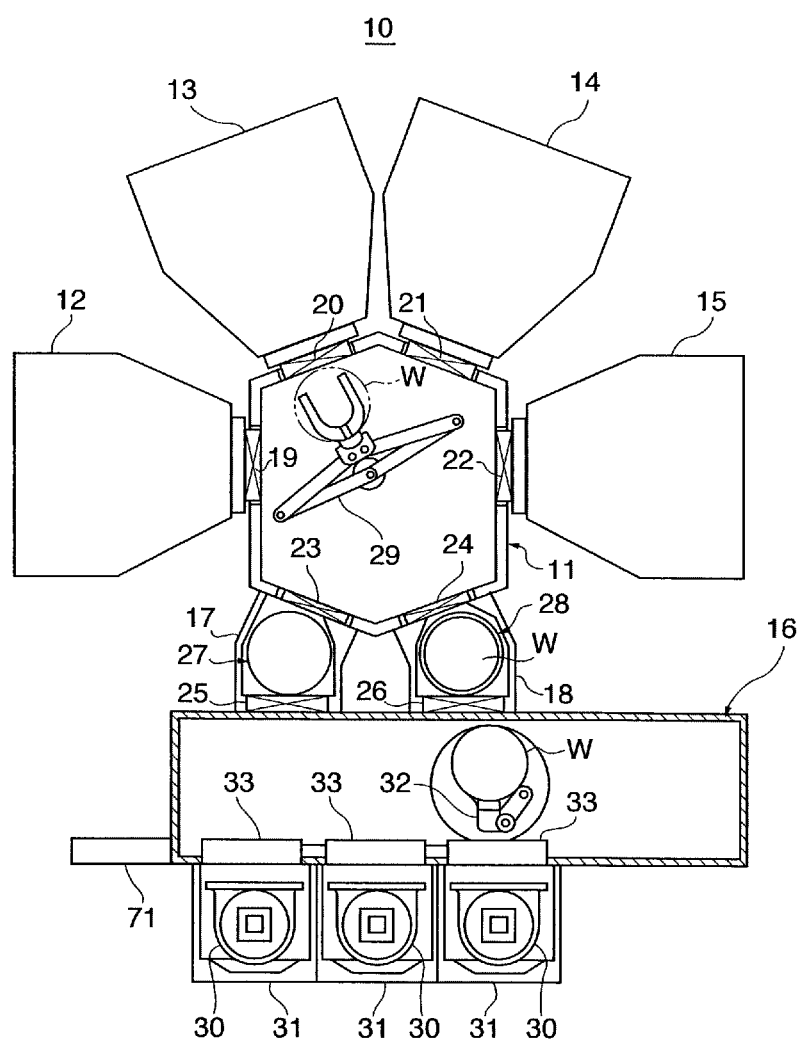
FIG. 1 is a plan view schematically showing the construction of a substrate processing system according to a first embodiment of the present invention.

FIG. 1 is a plan view schematically showing the construction of the substrate processing system according to the present embodiment.

As shown in FIG. 1, the substrate processing system 10 is comprised of a transfer module 11 (vacuum-type substrate transferring apparatus) having a hexagonal plan view, four processing modules 12 to 15 that are arranged in a radial manner around the transfer module 11 and in which predetermined processing is carried out on semiconductor device wafers (hereinafter referred to merely as "wafers") W (substrates), a loader module 16 as a rectangular common transfer chamber, and two load lock modules 17 and 18 that are each disposed between the transfer module 11 and the loader module 16 so as to link the transfer module 11 and the loader module 16 together.

The internal pressure of the transfer module 11 and each of the processing modules 12 to 15 is held at vacuum. The transfer module 11 is connected to the processing modules 12 to 15 by vacuum gate valves 19 to 22 respectively.

In the substrate processing system 10, the internal pressure of the loader module 16 is held at atmospheric pressure, whereas the internal pressure of the transfer module 11 is held at vacuum. The load lock modules 17 and 18 are thus provided respectively with a vacuum gate valve 23 or 24 in a connecting part between that load lock module and the transfer module 11, and an atmospheric door valve 25 or 26 in a connecting part between that load lock module and the loader module 16, whereby the load lock modules 17 and 18 are each constructed as a preliminary vacuum transfer chamber whose internal pressure can be adjusted. Moreover, the load lock modules 17 and 18 have respectively therein a wafer mounting stage 27 or 28 for temporarily mounting a wafer W being transferred between the loader module 16 and the transfer module 11.

The transfer module 11 has disposed therein a frog leg-type transfer arm 29 that can bend/elongate and turn. The transfer arm 29 transfers the wafers W between the processing modules 12 to 15 and the load lock modules 17 and 18.

In addition to the lock modules 17 and 18, the loader module 16 has connected thereto three FOUP mounting stages 31 on each of which is mounted a FOUP (Front Opening Unified Pod) 30, which is a container housing twenty-five of the wafers W.

The lock modules 17 and 18 are connected to a side wall of the loader module 16 in a longitudinal direction of the loader module 16, disposed facing the three FOUP mounting stages 31 with the loader module 16 therebetween.

A SCARA-type dual arm transfer arm mechanism 32 for transferring the wafers W is disposed inside the loader module 16, and three loading ports 33 through which the wafers W are introduced into the loader module 16 are disposed in a side wall of the loader module 16 in correspondence with the FOUP mounting stages 31. The transfer arm mechanism 32 removes a wafer W from a FOUP 30 mounted on a FOUP mounting stage 31 through the corresponding loading port 33, and transfers the removed wafer W into and out of the lock modules 17 and 18.

In the substrate processing system 10, of the processing modules 12 to 15, the processing module 12 (protective film forming apparatus) forms a CF-type protective film, described below, on a rear surface of each wafer W, the processing module 13 (etching apparatus) subjects each wafer W to the RIE processing, and the processing module 14 (protective film removing apparatus) removes the protective film formed on the rear surface of each wafer W. In the substrate processing system 10, each wafer W is transferred around in the order processing module 12, processing module 13, processing module 14.

Figure 2:
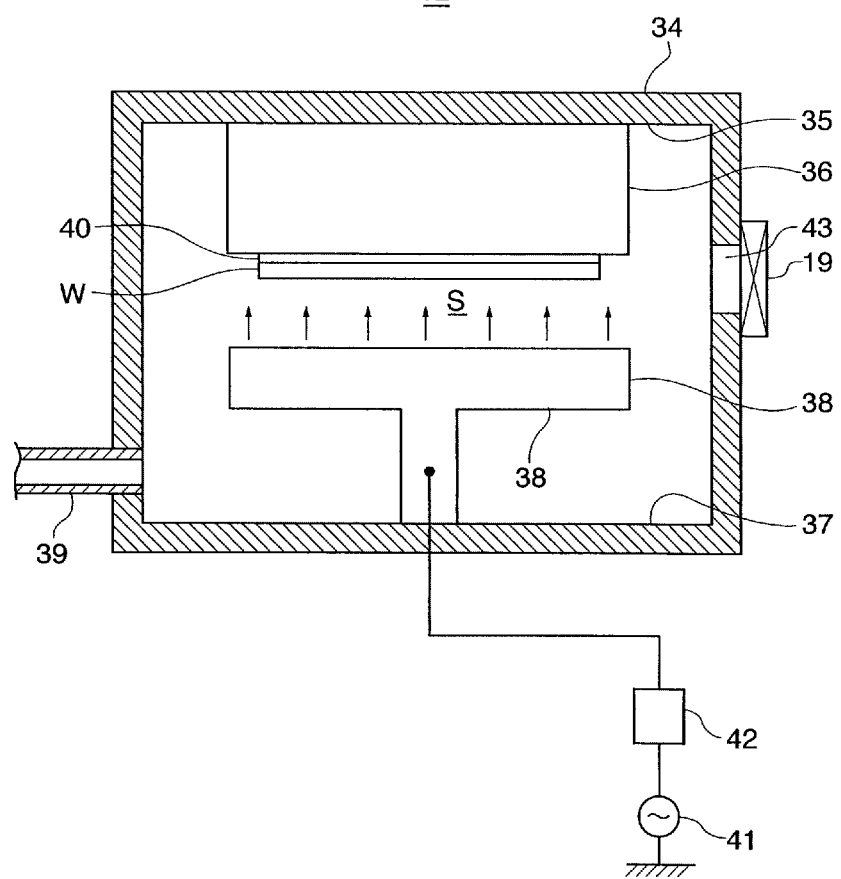
FIG. 2 is a sectional view schematically showing the construction of a processing module in which a CF-type protective film is formed on a rear surface of each wafer.

FIG. 2 is a sectional view schematically showing the construction of the processing module in which the CF-type protective film is formed on the rear surface of each wafer.

As shown in FIG. 2, the processing module 12 has a chamber 34 as a box-shaped housing chamber in which a wafer W is housed, a wafer attracting portion 36 that is disposed on a ceiling portion 35 of the chamber 34, an electrode 38 that is disposed on a bottom portion 37 of the chamber 34 facing the wafer attracting portion 36 separated from the wafer attracting portion 36 by a predetermined gap, and an exhaust pipe 39 for exhausting gas out from the chamber 34.

The wafer attracting portion 36 is a cylindrical projecting object, and has a plurality of vacuum suction holes (not shown) provided in a bottom surface thereof. A wafer W transferred into the chamber 34 is attracted by vacuum suction by the vacuum suction holes in the wafer attracting portion 36, and thus held on the bottom surface of the wafer attracting portion 36. Moreover, the wafer attracting portion 36 has a cushioning film 40 made of a heat-resistant resin such as a polyimide on the bottom surface thereof. A front surface of the wafer W thus contacts the bottom surface of the wafer attracting portion 36 via the cushioning film 40, and hence there is no destruction of the shape of wiring grooves or via holes formed on the front surface of the wafer W. Moreover, the wafer attracting portion 36 has a heater (not shown) built therein, so that a temperature of the wafer W is held at a predetermined temperature while a protective film is being formed on the rear surface of the wafer W.

The electrode 38 is comprised of a table-shaped electrically conductive member, and has a plurality of gas jetting holes (not shown) in a surface thereof facing the wafer attracting portion 36 (the upper surface). Moreover, a radio frequency power source 41 is connected to the electrode 38 via a matcher 42. The radio frequency power source 41 supplies predetermined radio frequency electrical power to the electrode 38. The electrode 38 thus applies radio frequency electrical power into a processing space S between the wafer attracting portion 36 and the electrode 38. The matcher 42 reduces reflection of the radio frequency electrical power from the electrode 38 so as to maximize the efficiency of the supply of the radio frequency electrical power into the electrode 38.

A transfer port 43 for the wafers W is provided in a side wall of the chamber 34 in a position at the height of a wafer W that is being attracted to the wafer attracting portion 36. The gate valve 19, which is for opening and closing the transfer port 43, is provided in the transfer port 43.

In the processing module 12, the protective film is formed on the rear surface of each wafer W by CVD (chemical vapor deposition) processing. Specifically, upon a depositable processing gas such as a CF-type gas is supplied into the processing space S from the gas jetting holes in the electrode 38, and radio frequency electrical power being applied into the processing space S, radicals and ions are produced from the CF-type gas, and these radicals and so on become attached to and accumulate on the rear surface of the wafer W attracted to the wafer attracting portion 36, thus forming a CF-type protective film. At this time, excess radicals and so on are exhausted to the outside by the exhaust pipe 39.

The protective film formed in the processing module 12 preferably has a thickness of not more than 10 μm, preferably approximately 1 μm. Note that the type of the protective film formed is not limited to being a CF-type protective film, but rather may alternatively be a protective film made of amorphous carbon.

Figure 3:
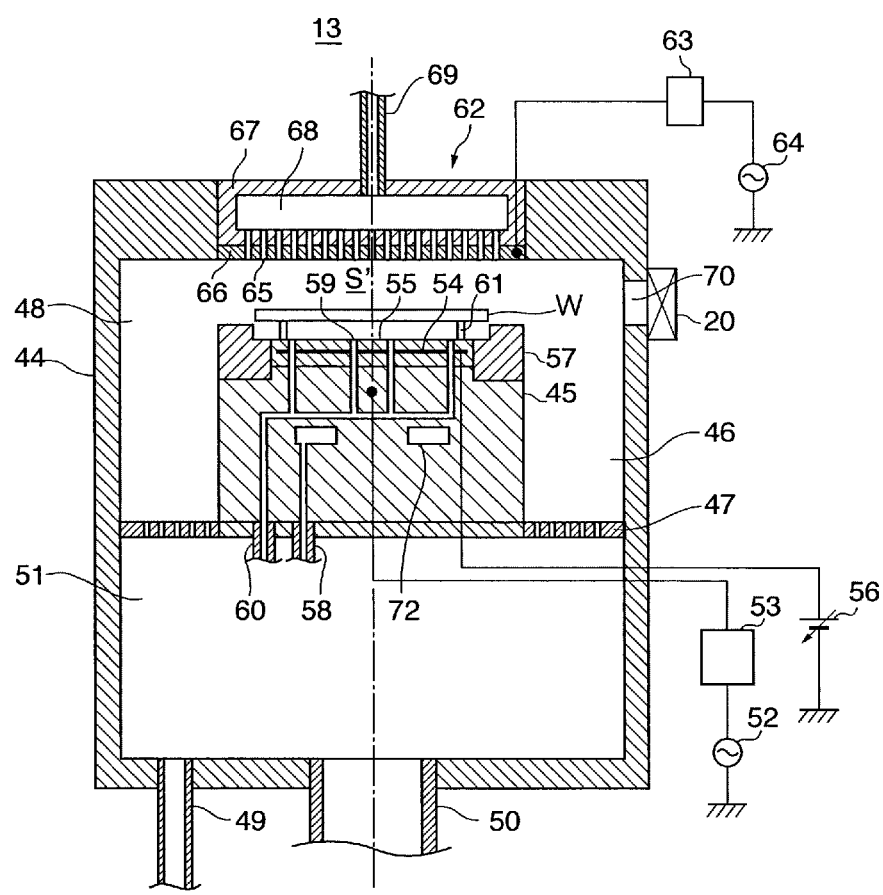
FIG. 3 is a sectional view schematically showing the construction of a processing module in which each wafer is subjected to RIE processing.

FIG. 3 is a sectional view schematically showing the construction of the processing module in which each wafer is subjected to the RIE processing.

As shown in FIG. 3, the processing module 13 has a chamber 44 in which a wafer W is housed. A cylindrical susceptor 45 is disposed in the chamber 44 as a stage on which the wafer is mounted.

In the processing module 13, a side exhaust path 46 that acts as a flow path through which gas above the susceptor 45 is exhausted out of the chamber 44 is formed between an inner wall of the chamber 44 and a side face of the susceptor 45. A baffle plate 47 is disposed part way along the side exhaust path 46.

The baffle plate 47 is a plate-shaped member having a large number of holes therein, and acts as a partitioning plate that partitions the chamber 44 into an upper portion and a lower portion. The upper portion 48 of the chamber 44 partitioned by the baffle plate 47 has disposed therein the susceptor 45 on which the wafer W is mounted, and has plasma produced therein. Hereinafter, the upper portion of the chamber 44 is referred to as the "reaction chamber". Moreover, the lower portion (hereinafter referred to as the "manifold") 51 of the chamber 44 has provided therein a roughing exhaust pipe 49 and a main exhaust pipe 50 that exhaust gas out from the chamber 44. The roughing exhaust pipe 49 has a DP (dry pump) (not shown) connected thereto, and the main exhaust pipe 50 has a TMP (Turbo-Molecular Pump) (not shown) connected thereto. Moreover, the baffle plate 47 captures or reflects ions and radicals produced in a processing space S', described below, in the reaction chamber 48, thus preventing leakage of the ions and radicals into the manifold 51.

The roughing exhaust pipe 49, the main exhaust pipe 50, the DP, the TMP, and so on together constitute an exhausting apparatus. The roughing exhaust pipe 49 and the main exhaust pipe 50 exhaust gas in the reaction chamber 48 out of the chamber 44 via the manifold 51. Specifically, the roughing exhaust pipe 49 reduces the pressure in the chamber 44 from atmospheric pressure down to a low vacuum state, and the main exhaust pipe 50 is operated in collaboration with the roughing exhaust pipe 49 to reduce the pressure in the chamber 44 from atmospheric pressure down to a high vacuum state (e.g. a pressure of not more than 133 Pa (1 Torr)), which is at a lower pressure than the low vacuum state.

A lower radio frequency power source 52 is connected to the susceptor 45 via a matcher 53. The lower radio frequency power source 52 supplies predetermined radio frequency electrical power to the susceptor 45. The susceptor 45 thus acts as a lower electrode. The matcher 53 reduces reflection of the radio frequency electrical power from the susceptor 45 so as to maximize the efficiency of the supply of the radio frequency electrical power into the susceptor 45.

Provided in an upper portion of the susceptor 45 is a disk-shaped electrostatic chuck 55 made of an insulating material, for example yttria, alumina ($Al_2O_3$) or silica ($SiO_2$), having an electrode plate 54 therein. When a wafer W is mounted on the susceptor 45, the wafer W is disposed on the electrostatic chuck 55. A DC power source 56 is electrically connected to the electrode plate 54. Upon a negative DC voltage being applied to the electrode plate 54, a positive potential is produced on the rear surface of the wafer W, and a negative potential is produced on the front surface of the wafer. A potential difference thus arises between the electrode plate 54 and the rear surface of the wafer W, and hence the wafer W is attracted to and held on an upper surface of the electrostatic chuck 55 through a Coulomb force or a Johnsen-Rahbek force due to the potential difference.

Moreover, an annular focus ring 57 is provided on an upper portion of the susceptor 45 so as to surround the wafer W attracted to and held on the electrostatic chuck 55. The focus ring 57 is exposed to the processing space S', and focuses plasma in the processing space S' toward the front surface of the wafer W, thus improving the efficiency of the RIE processing.

An annular coolant chamber 72 that extends, for example, in a circumferential direction of the susceptor 45 is provided inside the susceptor 45. A coolant, for example cooling water or a Galden (registered trademark) fluid, at a predetermined temperature is circulated through the coolant chamber 72 via coolant piping 58 from a chiller unit (not shown). A processing temperature of the wafer W attracted to and held on the electrostatic chuck 55 is controlled through the temperature of the coolant.

A plurality of heat-transmitting gas supply holes 59 are provided in a portion of the electrostatic chuck 55 on which the wafer W is attracted and held (hereinafter referred to as the "attracting surface"). The heat-transmitting gas supply holes 59 are connected to a heat-transmitting gas supply unit (not shown) by a heat-transmitting gas supply line 60. The heat-transmitting gas supply unit supplies helium gas as a heat-transmitting gas via the heat-transmitting gas supply holes 59 into a gap between the attracting surface of the electrostatic chuck 55 and the rear surface of the wafer W. The helium gas supplied into the gap between the attracting surface of the electrostatic chuck 55 and the rear surface of the wafer W transmits heat from the wafer W to the susceptor 45 via the electrostatic chuck 55.

A plurality of pusher pins 61 are provided in the attracting surface of the susceptor 45 as lifting pins that can be made to project out from the electrostatic chuck 55. The pusher pins 61 are connected to a motor (not shown) by a ball screw (not shown), and can be made to project out from the attracting surface of the susceptor 45 through rotational motion of the motor, which is converted into linear motion by the ball screw. The pusher pins 61 are housed inside the susceptor 45 when a wafer W is being attracted to and held on the attracting surface of the susceptor 45 so that the wafer W can be subjected to the RIE processing, and are made to project out from the electrostatic chuck 55 so as to lift the wafer W up away from the susceptor 45 when the wafer W is to be transferred out from the chamber 44 after having been subjected to the RIE processing.

A gas introducing shower head 62 is disposed in a ceiling portion of the chamber 44 (the reaction chamber 48) such as to face the susceptor 45. An upper radio frequency power source 64 is connected to the gas introducing shower head 62 via a matcher 63. The upper radio frequency power source 64 supplies predetermined radio frequency electrical power to the gas introducing shower head 62. The gas introducing shower head 62 thus acts as an upper electrode. The matcher 63 has a similar function to the matcher 53, described earlier.

The gas introducing shower head 62 has a ceiling electrode plate 66 having a large number of gas holes 65 therein, and an electrode support 67 on which the ceiling electrode plate 66 is detachably supported. A buffer chamber 68 is provided inside the electrode support 67. A processing gas introducing pipe 69 is connected to the buffer chamber 68. A processing gas supplied from the processing gas introducing pipe 69 into the buffer chamber 68 is supplied by the gas introducing shower head 62 into the chamber 44 (the reaction chamber 48) via the gas holes 65.

A transfer port 70 for the wafers W is provided in a side wall of the chamber 44 in a position at the height of a wafer W that has been lifted up from the susceptor 45 by the pusher pins 61. The gate valve 20, which is for opening and closing the transfer port 70, is provided in the transfer port 70.

Radio frequency electrical power is supplied to the susceptor 45 and the gas introducing shower head 62 in the chamber 44 of the processing module 13 as described above so as to apply radio frequency electrical power into the processing space S' between the susceptor 45 and the gas introducing shower head 62, whereupon the processing gas supplied into the processing space S' from the gas introducing shower head 62 is turned into high-density plasma, whereby ions and radicals are produced; the wafer W is subjected to the RIE processing by the ions and so on.

The processing module 14 has a similar construction to the processing module 13. Description of the construction of the processing module 14 is thus omitted.

In the processing module 14, a wafer W that has been subjected to the RIE processing in the processing module 13 is transferred into the chamber 44 and supported by the pusher pins 61, and then oxygen ($O_2$) gas is introduced into the processing space S' from the gas introducing shower head 62. At this time, the pusher pins 61 support the wafer W in a state lifted up from the susceptor 45. There is thus a space below the rear surface of the wafer W.

Upon radio frequency electrical power being supplied to the susceptor 45 and the gas introducing shower head 62 so as to apply radio frequency electrical power into the processing space S' between the susceptor 45 and the gas introducing shower head 62, plasma is produced from the oxygen gas in the processing space S', whereby oxygen radicals are produced. At this time, the oxygen radicals go round into the space below the rear surface of the wafer W, and hence the oxygen radicals decompose the CF-type protective film on the rear surface of the wafer W and thus remove the CF-type protective film (ashing processing).

Note that in the processing module 14, the CF-type protective film is removed by oxygen radicals, but alternatively fluorine radicals may be produced in the processing space S', the CF-type protective film on the rear surface of the wafer W being decomposed and thus removed by the fluorine radicals, or ozone gas may be supplied into the processing space S', the CF-type protective film being decomposed and thus removed by the ozone gas.

Returning to FIG. 1, the substrate processing system 10 further has a system controller (not shown) that controls operation of the component elements of the substrate processing system 10, for example the transfer module 11, the processing modules 12 to 15, and the loader module 16, and an operation panel 71 that is disposed at one end of the loader module 16 in the longitudinal direction of the loader module 16.

The operation panel 71 has a display section comprised of, for example, an LCD (liquid crystal display), for displaying the state of operation of the component elements of the substrate processing system 10.

According to the substrate processing system 10 described above, a CF-type protective film is formed through CVD processing on the rear surface of each wafer W before the RIE processing is carried out, and then the CF-type protective film is removed from the rear surface of the wafer W through ashing processing after the RIE processing has been carried out. As a result, the CF-type protective film can be formed reliably, and can be removed reliably. Moreover, in the processing module 13, the electrostatic chuck 55 contacts the CF-type protective film formed on the rear surface of each wafer W. The rear surface of the wafer W can thus be prevented from being scratched when the wafer W is attracted to the electrostatic chuck 55, and moreover the adhesion between the wafer W and the electrostatic chuck can be improved, and hence the controllability of the temperature of the wafer W can be improved.

In the substrate processing system 10, the CF-type protective film is formed through CVD processing in the processing module 12, and hence the processing module 12 is a vacuum-type processing apparatus. Here, the processing module 13 in which each wafer W is subjected to the RIE processing is also a vacuum-type processing apparatus, and the transfer module 11 is a vacuum-type substrate transferring apparatus, and hence the processing module 12 and the processing module 13 can be connected together via the transfer module 11. As a result, the formation of the CF-type protective film on the rear surface of each wafer W and the RIE processing on the wafer W can be carried out one after the other smoothly.

Moreover, in the substrate processing system 10, the protective film is removed through ashing processing in the processing module 14, and hence the processing module 14 is a vacuum-type processing apparatus. Here, the processing module 13 is also a vacuum-type processing apparatus, and the transfer module 11 is a vacuum-type substrate transferring apparatus, and hence the processing module 13 and the processing module 14 can be connected together via the transfer module 11. As a result, the RIE processing on each wafer W and the removal of the CF-type protective film can be carried out one after the other smoothly.

Note that in the substrate processing system 10 described above, a CF-type protective film is formed through CVD processing in the processing module 12, but the protective film is not limited to being a CF-type protective film. Moreover, the method of forming the protective film is not limited to being CVD processing, but rather any vapor deposition may be used, for example PVD (physical vapor deposition) processing.

Next, a substrate processing system according to a second embodiment of the present invention will be described.

In the present embodiment, the construction and operation are basically the same as in the first embodiment described above, only the protective film forming apparatus and the protective film removing apparatus differing to in the first embodiment. Description of features of the construction that are the same as in the first embodiment is thus omitted, only features of the operation that differ to in the first embodiment being described below.

Figure 4:
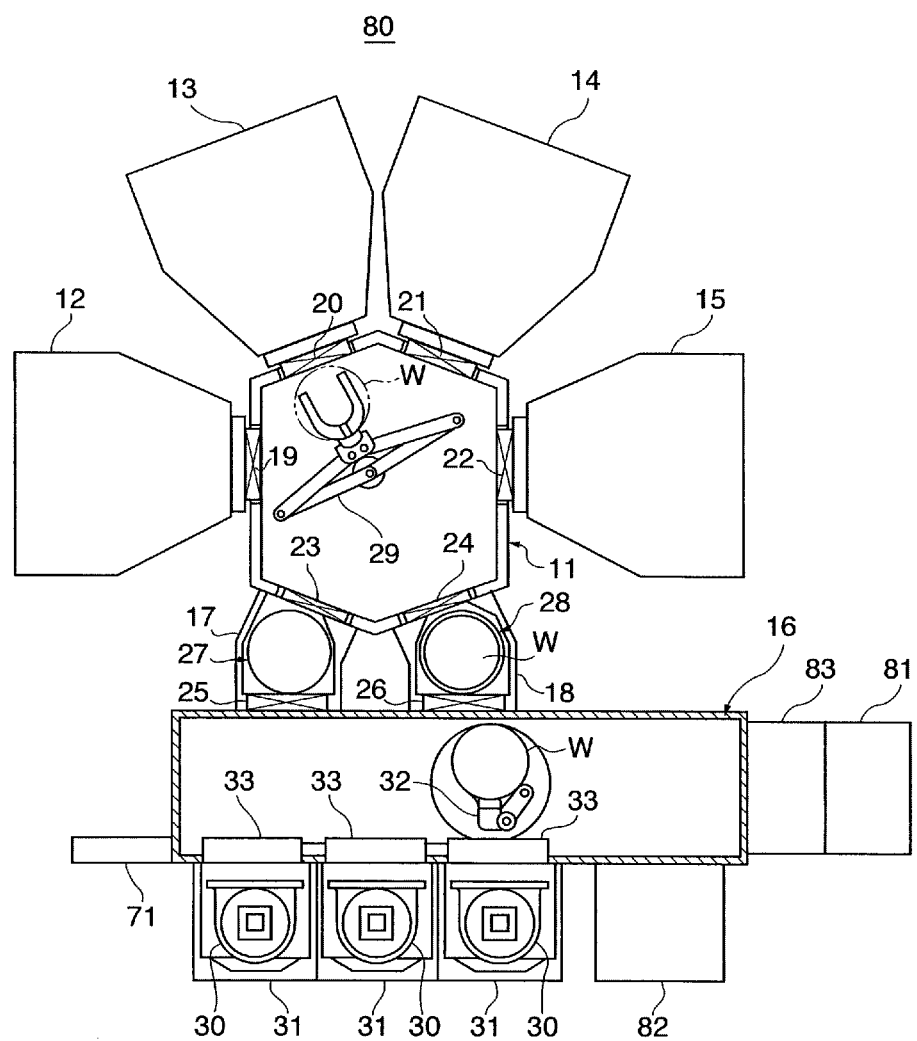
FIG. 4 is a plan view schematically showing the construction of a substrate processing system according to a second embodiment of the present invention.

FIG. 4 is a plan view schematically showing the construction of the substrate processing system according to the present embodiment.

As shown in FIG. 4, in the substrate processing system 80, in addition to the lock modules 17 and 18 and the FOUP mounting stages 31, the loader module 16 (atmospheric-type substrate transferring apparatus) has connected thereto, via a wafer inverting unit 83 that inverts each wafer W, a coating unit 81 (protective film forming apparatus) for forming a protective film made of a photosensitive resin on the rear surface of each wafer W, and further has connected thereto a cleaning unit 82 for removing the protective film from the rear surface of each wafer W. Specifically, the coating unit 81 is disposed at one end of the loader module 16 in the longitudinal direction of the loader module 16, and the cleaning unit 82 is disposed alongside the three FOUP mounting stages 31. In the substrate processing system 80, each wafer W is transferred around in the order coating unit 81, processing module 13, cleaning unit 82.

Figure 5:
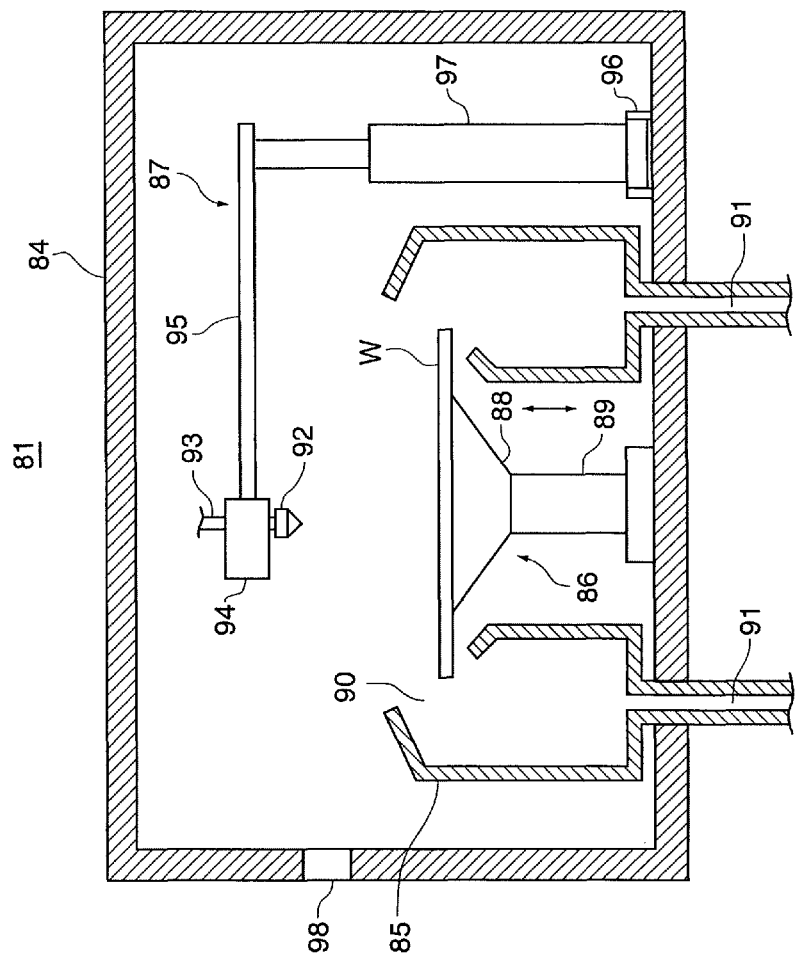
FIG. 5 is a sectional view schematically showing the construction of a coating unit that forms a protective film made of a photosensitive resin on the rear surface of each wafer.

FIG. 5 is a sectional view schematically showing the construction of a coating unit that forms the protective film made of the photosensitive resin on the rear surface of each wafer.

As shown in FIG. 5, the coating unit 81 is comprised of a chamber 84 as a box-shaped housing chamber in which a wafer W is housed, a spinning chuck 86 disposed in a central portion of the chamber 84, an annular cup 85 disposed such as to surround the spinning chuck 86, and a coating liquid ejecting apparatus 87.

The spinning chuck 86 is comprised of a stage 88 on which the wafer W is mounted, and a shaft 89 that extends downwards from a lower portion of the stage 88. The shaft 89 supports the stage 88 such that an upper surface of the stage 88 is horizontal. The stage 88 has a plurality of vacuum suction holes (not shown) provided in the upper surface thereof. The wafer W mounted on the stage 88 is attracted by vacuum suction to the upper surface of the stage 88 by the vacuum suction holes. The stage 88 also has a cushioning film (not shown) made of a resin on the upper surface thereof. Here, each wafer W is inverted by the wafer inverting unit 83 before being transferred into the chamber 84. The front surface of the wafer W is thus attracted by vacuum suction to the upper surface of the stage 88 via the cushioning film, and hence there is no destruction of the shape of wiring grooves or via holes formed on the front surface of the wafer W.

Moreover, the rear surface of the wafer W is exposed to the interior of the chamber 84. The shaft 89 is rotated about a central axis of the shaft by a motor (not shown). The wafer W attracted by vacuum suction to the upper surface of the stage 88 thus rotates in a horizontal plane. Moreover, the shaft 89 can be raised and lowered by an air cylinder (not shown).

The cup 85 is an annular vessel, and has in an upper portion thereof an opening 90 provided around the whole circumference thereof. When the wafer W attracted by vacuum suction to the stage 88 is lowered, a peripheral portion of the wafer W is housed in the opening 90. The cup 85 also has an excess liquid discharge pipe 91 in a bottom portion thereof.

The coating liquid ejecting apparatus 87 has a nozzle 92 disposed facing the wafer W attracted by vacuum suction to the upper surface of the stage 88, a coating liquid supply pipe 93 that connects the nozzle 92 to a coating liquid supply apparatus (not shown) that supplies a coating liquid, a nozzle holder 94 to which the nozzle 92 is detachably attached, and a nozzle scanning arm 95 having the nozzle holder 94 on a distal end thereof. The nozzle scanning arm 95 is attached to an upper end of a vertical supporting member 97 that can be moved horizontally through a guide rail 96 that is installed on the bottom portion of the chamber 84. The nozzle scanning arm 95 can thus be moved in a depth direction in FIG. 5 together with the vertical supporting member 97.

A transfer port 98 for the wafers W is provided in a side wall of the chamber 84 in a position at the height of a wafer W that has been lifted up by the spinning chuck 86.

In the coating unit 81, the nozzle 92 ejects the coating liquid, for example a photosensitive resin liquid, toward the rear surface of the wafer W, which rotates in a horizontal plane. Upon the ejected coating liquid reaching the rear surface of the wafer W, the coating liquid spreads out uniformly over the rear surface of the wafer W through centrifugal force. As a result, the photosensitive resin is coated uniformly over the rear surface of the wafer W (spin coating processing). At this time, excess photosensitive resin liquid is caught by the cup 85, and discharged to the outside via the excess liquid discharge pipe 91.

The coating unit 81 also has a UV lamp (not shown) or the like that irradiates the rear surface of the wafer W with UV light, thus exposing and hence curing the photosensitive resin that has been coated onto the rear surface of the wafer W. As a result, a protective film is formed on the rear surface of the wafer W.

An example of the photosensitive resin used in the coating unit 81 is a resin containing a cellulose derivative having carboxyl groups and having an acid value of 30 to 220 mgKOH/g.

The coating liquid coated onto the rear surface of each wafer W in the coating unit 81 may alternatively be a thermosetting resin liquid, for example a polyimide-containing resin liquid. In this case, instead of the UV lamp, the coating unit 81 has a heater for heating the rear surface of the wafer W.

The wafer W having the protective film formed on the rear surface thereof by the coating unit 81 is inverted by the wafer inverting unit 83 after being transferred out from the chamber 84, and is then further transferred by the loader module 16.

Figure 6:
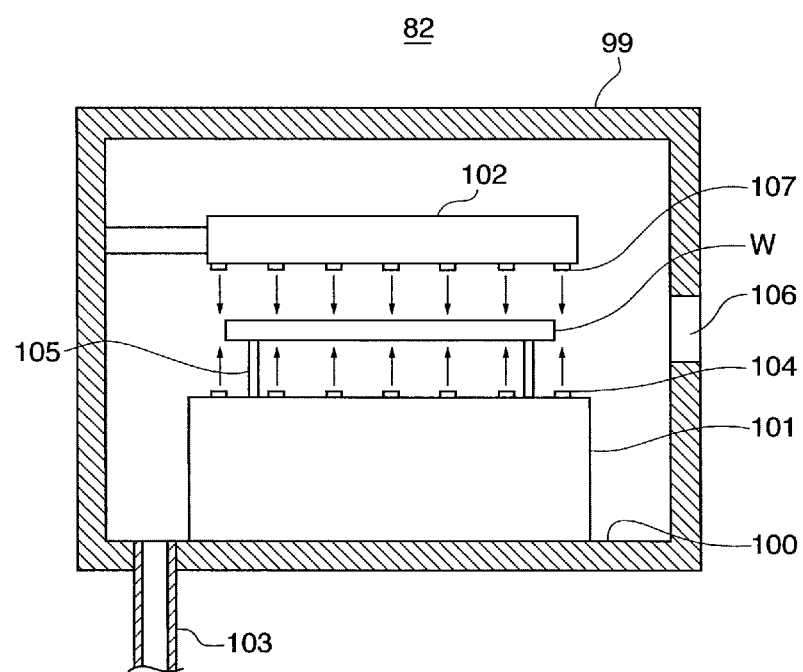
FIG. 6 is a sectional view schematically showing the construction of a cleaning unit that removes the protective film made of the photosensitive resin from the rear surface of each wafer.

FIG. 6 is a sectional view schematically showing the construction of a cleaning unit that removes the protective film made of the photosensitive resin from the rear surface of each wafer.

As shown in FIG. 6, the cleaning unit 82 is comprised of a chamber 99 as a box-shaped housing chamber in which a wafer W is housed, a stage 101 that is disposed on a bottom portion 100 of the chamber 99, a head 102 that is disposed facing the stage 101 separated from the stage 101 by a predetermined gap, and a discharge pipe 103 that discharges a washing liquid or the like, described below, out of the chamber 99.

The stage 101 is a cylindrical projecting object, and has a plurality of washing liquid jetting portions 104 in an upper surface thereof. A plurality of lifting pins 105 are disposed in the upper surface of the stage 101. The lifting pins 105 contact the rear surface of a wafer W that has been transferred into the chamber 99, and thus support the wafer W. The lifting pins 105 can be made to project out from the upper surface of the stage 101, whereby the lifting pins 105 can move the wafer W in an up/down direction in FIG. 6. When the protective film on the rear surface of a wafer W is to be removed, the lifting pins 105 move the wafer W so that the wafer W is positioned at an intermediate point between the head 102 and the stage 101, and when the wafer W is to be transferred in or out, the lifting pins 105 move the wafer W so that the wafer W is positioned at the height of a wafer W transfer port 106 provided in a side wall of the chamber 99. Moreover, the head 102 is comprised of a substantially disk-shaped member, and has a plurality of washing liquid jetting portions 107 in a lower surface thereof.

In the cleaning unit 82, the washing liquid is jetted out from the washing liquid jetting portions 104 facing the rear surface of the wafer W supported by the lifting pins 105, and moreover the washing liquid is jetted out from the washing liquid jetting portions 107 facing the front surface of the wafer W. Examples of the washing liquid are an alkaline aqueous solution, a hydrogen peroxide aqueous solution, and sulfuric acid solution. The washing liquid dissolves and thus removes a resist film formed on the front surface of the wafer W, and moreover dissolves and thus removes the protective film made of the photosensitive resin formed on the rear surface of the wafer W (wet washing processing).

According to the substrate processing system 80 described above, a protective film made of a photosensitive resin is formed through spin coating processing (coating processing) on the rear surface of each wafer W before the RIE processing is carried out, and then the protective film is removed from the rear surface of the wafer W by being dissolved by a washing liquid after the RIE processing has been carried out. As a result, the protective film made of the photosensitive resin can be formed easily and reliably, and can be removed easily and reliably. Moreover, in the processing module 13, the electrostatic chuck 55 contacts the protective film made of the photosensitive resin formed on the rear surface of each wafer W. The rear surface of the wafer W can thus be prevented from being scratched when the wafer W is attracted to the electrostatic chuck 55, and moreover the adhesion between the wafer W and the electrostatic chuck can be improved, and hence the controllability of the temperature of the wafer W can be improved.

In the substrate processing system 80, foreign matter, for example fine particles due to photosensitive resin being scattered from the wafer W, may be produced during the spin coating processing in the coating unit 81. However, the coating unit 81 is connected to the loader module 16 and hence is not connected to the transfer module 11 directly, and thus foreign matter produced in the coating unit 81 can be prevented from infiltrating into the processing module 13 used as the etching apparatus via the transfer module 11.

Moreover, in the substrate processing system 80, when the protective film is dissolved and thus removed by the washing liquid in the cleaning unit 82, the washing liquid may be scattered from the cleaning unit 82. However, the cleaning unit 82 is connected to the loader module 16 and hence is not connected to the transfer module 11 directly, and thus the washing liquid and the like can be prevented from infiltrating into the processing module 13 via the transfer module 11.

Note that in the substrate processing system 80 described above, the protective film made of the photosensitive resin formed on the rear surface of each wafer W may alternatively be removed through ashing processing. In this case, the removal of the protective film is carried out in the processing module 14.

Moreover, the substrate processing system 80 need not have the wafer inverting unit 83. In this case, the coating unit preferably has a nozzle that sprays the photosensitive resin liquid toward the rear surface of each wafer W from below the wafer W, which rotates in a horizontal plane. The photosensitive resin liquid is sticky, and hence becomes attached to the rear surface of the wafer W, and then spreads out uniformly over the rear surface of the wafer W through centrifugal force.

Furthermore, instead of forming the protective film on the rear surface of each wafer W through spin coating processing as described above, the protective film may be formed by sticking a resin sheet onto the rear surface of each wafer W.

Moreover, the substrates subjected to the etching processing in the substrate processing system according to each of the embodiments described above are not limited to being semiconductor wafers, but rather may be any of various substrates used in LCDs (liquid crystal displays), FPDs (flat panel displays) or the like, or photomasks, CD substrates, printed substrates, or the like.

The above-described embodiments are merely exemplary of the present invention, and are not be construed to limit the scope of the present invention.

The scope of the present invention is defined by the scope of the appended claims, and is not limited to only the specific descriptions in this specification. Furthermore, all modifications and changes belonging to equivalents of the claims are considered to fall within the scope of the present invention.

What is claimed is:

1. A substrate processing method implemented in a substrate processing system comprising an etching apparatus that carries out plasma etching processing on a substrate and a vacuum-type substrate transferring apparatus to which the etching apparatus is connected, the etching apparatus having therein an electrostatic chuck that electrostatically attracts the substrate, the substrate processing method comprising:

a first step of forming a protective film on a rear surface of the substrate before the plasma etching processing is carried out, the protective film preventing the rear surface of the substrate from being scratched by the electrostatic chuck during the plasma etching processing;

a second step of electrostatically attracting the substrate to the electrostatic chuck such that the electrostatic chuck directly contacts the rear surface of the substrate and of carrying out the plasma etching processing on the substrate; and a third step of removing the protective film from the rear surface of the substrate after the plasma etching processing has been carried out, wherein in said first step, the protective film is formed through vapor deposition processing.

2. A substrate processing method as claimed in claim 1, wherein the protective film is comprised of a CF-type protective film and a thickness thereof is not more than 10 μm.

3. A substrate processing method as claimed in claim 1, wherein the vapor deposition processing is CVD processing.

4. A substrate processing method as claimed in claim 1, wherein in said third step, the protective film is removed through ashing processing.

5. A substrate processing method as claimed in claim 4, wherein in said third step, the substrate is lifted up such as to form a space below the rear surface of the substrate.

6. A substrate processing method as claimed in claim 1, wherein in said third step, the protective film is removed through wet washing processing.

7. A substrate processing method as claimed in claim 1, wherein the vapor deposition processing is PVD processing.

8. A substrate processing method implemented in a substrate processing system comprising an etching apparatus that carries out plasma etching processing on a substrate and a vacuum-type substrate transferring apparatus to which the etching apparatus is connected, the etching apparatus having therein an electrostatic chuck that electrostatically attracts the substrate, the substrate processing method comprising:

a first step of forming a protective film on a rear surface of the substrate before the plasma etching processing is carried out, the protective film preventing the rear surface of the substrate from being scratched by the electrostatic chuck during the plasma etching processing;

a second step of electrostatically attracting the substrate to the electrostatic chuck such that the electrostatic chuck directly contacts the rear surface of the substrate and of carrying out the plasma etching processing on the substrate; and a third step of removing the protective film from the rear surface of the substrate after the plasma etching processing has been carried out, wherein in said first step, the protective film is formed through spin coating processing.

9. A substrate processing method as claimed in claim 8, wherein during the spin coating processing, a photosensitive resin is coated onto the rear surface of the substrate and the coated photosensitive resin is cured through irradiation of UV light.

10. A substrate processing method as claimed in claim 8, wherein in said third step, the protective film is removed through ashing processing.

11. A substrate processing method as claimed in claim 8, wherein in said third step, the protective film is removed through wet washing processing.

12. A substrate processing method as claimed in claim 7, wherein in said third step, the substrate is lifted up such as to form a space below the rear surface of the substrate.

* * * * *